United States Patent
Tomai et al.

(10) Patent No.: US 11,769,840 B2
(45) Date of Patent: Sep. 26, 2023

(54) OXIDE SEMICONDUCTOR SUBSTRATE AND SCHOTTKY BARRIER DIODE

(71) Applicant: IDEMITSU KOSAN CO., LTD., Tokyo (JP)

(72) Inventors: Shigekazu Tomai, Sodegaura (JP); Masatoshi Shibata, Sodegaura (JP); Emi Kawashima, Sodegaura (JP); Koki Yano, Sodegaura (JP); Hiromi Hayasaka, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 0 days.

(21) Appl. No.: 15/605,779

(22) Filed: May 25, 2017

(65) Prior Publication Data

US 2017/0263786 A1 Sep. 14, 2017

Related U.S. Application Data

(63) Continuation of application No. 14/912,815, filed as application No. PCT/JP2014/004153 on Aug. 8, 2014, now Pat. No. 9,691,910.

(30) Foreign Application Priority Data

Aug. 19, 2013 (JP) .................... 2013-169966

(51) Int. Cl.
*H01L 29/87* (2006.01)
*H01L 29/47* (2006.01)
(Continued)

(52) U.S. Cl.
CPC ............ *H01L 29/872* (2013.01); *H01L 29/04* (2013.01); *H01L 29/24* (2013.01); *H01L 29/247* (2013.01);
(Continued)

(58) Field of Classification Search
CPC ............ H01L 29/47–475; H01L 29/872–8725
See application file for complete search history.

(56) References Cited

U.S. PATENT DOCUMENTS 4,358,782 A * 11/1982 Takasuka ............... H01L 31/062
136/255
4,782,302 A * 11/1988 Bastasz ................ G01N 27/129
257/414

(Continued)

FOREIGN PATENT DOCUMENTS

CN 102332474 A * 1/2012
JP H5-036975 A 2/1993
(Continued)

OTHER PUBLICATIONS

English Translation of CN102332474A, EscapeNet, 2012. (Year: 2012).*

(Continued)

*Primary Examiner* — Didarul A Mazumder
(74) *Attorney, Agent, or Firm* — Foley & Lardner LLP

(57) ABSTRACT

A schottky barrier diode element having a silicon (Si) substrate, an oxide semiconductor layer and a schottky electrode layer, wherein the oxide semiconductor layer includes a polycrystalline and/or amorphous oxide semiconductor having a band gap of 3.0 eV or more and 5.6 eV or less.

16 Claims, 2 Drawing Sheets

(51) Int. Cl.
*H01L 29/872* (2006.01)
*H01L 29/861* (2006.01)
*H01L 29/26* (2006.01)
*H01L 29/66* (2006.01)
*H01L 29/04* (2006.01)
*H01L 29/24* (2006.01)

(52) U.S. Cl.
CPC ............. *H01L 29/26* (2013.01); *H01L 29/47* (2013.01); *H01L 29/66969* (2013.01); *H01L 29/861* (2013.01)

(56) References Cited

U.S. PATENT DOCUMENTS

| | | | |
|---|---|---|---|
| 5,457,333 A * | 10/1995 | Fukui | G01N 27/12 257/252 |
| 5,789,311 A | 8/1998 | Ueno et al. | |
| 7,389,675 B1 * | 6/2008 | Hunter | G01N 27/005 257/253 |
| 7,863,611 B2 | 1/2011 | Abe et al. | |
| 8,203,146 B2 | 6/2012 | Abe et al. | |
| 8,421,087 B2 * | 4/2013 | Arai | H01L 24/40 257/341 |
| 8,546,879 B2 | 10/2013 | Disney et al. | |
| 8,586,905 B2 | 11/2013 | Kurokawa | |
| 8,902,082 B2 | 12/2014 | Roesner | |
| 2006/0108636 A1 * | 5/2006 | Sano | H01L 21/02422 257/E21.462 |
| 2006/0113565 A1 | 6/2006 | Abe et al. | |
| 2006/0137737 A1 * | 6/2006 | Nakayama | H01L 31/0392 136/255 |
| 2007/0210316 A1 | 9/2007 | Yonezawa et al. | |
| 2007/0257257 A1 * | 11/2007 | Cho | H01L 21/31691 257/43 |
| 2008/0073653 A1 * | 3/2008 | Iwasaki | H01L 29/7869 257/79 |
| 2008/0087897 A1 * | 4/2008 | Iwakami | H01L 29/452 257/76 |
| 2009/0090914 A1 * | 4/2009 | Yano | C01G 19/00 257/66 |
| 2009/0289251 A1 | 11/2009 | Kiyotoshi | |
| 2010/0019279 A1 * | 1/2010 | Chen | H01L 27/0605 257/E21.403 |
| 2010/0102309 A1 * | 4/2010 | Nakahara | H01L 29/045 257/43 |
| 2010/0224872 A1 * | 9/2010 | Kimura | H01L 27/1288 257/43 |
| 2010/0224878 A1 | 9/2010 | Kimura | |
| 2010/0258802 A1 | 10/2010 | Godo et al. | |
| 2011/0024741 A1 | 2/2011 | Abe et al. | |
| 2011/0050733 A1 * | 3/2011 | Yano | C23C 14/086 345/690 |
| 2011/0101338 A1 * | 5/2011 | Yamazaki | H01L 29/861 257/E29.083 |
| 2011/0127579 A1 | 6/2011 | Yamazaki | |
| 2011/0133191 A1 * | 6/2011 | Yamazaki | H01L 27/1225 257/57 |
| 2011/0198483 A1 | 8/2011 | Kurokawa | |
| 2011/0198603 A1 * | 8/2011 | Choi | H01L 27/1214 257/66 |
| 2012/0261658 A1 * | 10/2012 | Akasaka | H01L 29/47 257/43 |
| 2013/0043534 A1 | 2/2013 | Disney et al. | |
| 2013/0088345 A1 | 4/2013 | Roesner | |
| 2013/0313569 A1 * | 11/2013 | Usagawa | H01L 29/78 257/77 |
| 2013/0313634 A1 | 11/2013 | Liu | |
| 2013/0320326 A1 * | 12/2013 | Kurihara | C08F 20/28 257/40 |
| 2014/0077263 A1 * | 3/2014 | Yoshioka | H01L 29/207 257/191 |
| 2014/0103471 A1 * | 4/2014 | Lupino | H01L 27/224 257/421 |
| 2014/0332823 A1 * | 11/2014 | Takizawa | H01L 29/267 257/76 |
| 2015/0091629 A1 | 4/2015 | Ishizu et al. | |
| 2015/0200668 A1 | 7/2015 | Uesugi et al. | |
| 2015/0228324 A1 | 8/2015 | Aoki et al. | |
| 2015/0236061 A1 | 8/2015 | Kurokawa | |
| 2015/0270270 A1 | 9/2015 | Kato | |
| 2015/0357586 A1 * | 12/2015 | Horiuchi | C09K 11/06 257/40 |
| 2015/0357587 A1 * | 12/2015 | Kishino | C09K 11/06 257/40 |
| 2016/0126283 A1 | 5/2016 | Ohmaru | |
| 2016/0226490 A1 | 8/2016 | Kozuma et al. | |
| 2016/0233865 A1 | 8/2016 | Tamura et al. | |
| 2016/0247548 A1 | 8/2016 | Yamazaki et al. | |

FOREIGN PATENT DOCUMENTS

| | | |
|---|---|---|
| JP | H8-097441 A | 4/1996 |
| JP | 2004-022878 A | 1/2004 |
| JP | 2006-165532 A | 6/2006 |
| JP | 2008-021689 A | 1/2008 |
| JP | 4929882 B2 | 1/2008 |
| JP | 2009-164237 A | 7/2009 |
| JP | 2009-194225 A | 8/2009 |
| JP | 2009-253142 A | 10/2009 |
| JP | 2010-182852 A | 8/2010 |
| JP | 2010-263195 A | 11/2010 |
| JP | 2012-084858 A | 4/2012 |
| JP | 2012-138552 A | 7/2012 |
| JP | 2012-216863 A | 11/2012 |
| JP | 2013-102189 A | 5/2013 |
| TW | 200915579 A | 4/2009 |
| TW | 201321243 A1 | 6/2013 |
| TW | 201330254 A1 | 7/2013 |
| WO | WO-2008/096768 A1 | 8/2008 |

OTHER PUBLICATIONS

Chinese Office Action dated Jun. 4, 2018 in corresponding application No. 201480045490.5.
Office Action dated Aug. 11, 2017 in Taiwanese Patent Application No. 103128165.
International Search Report issued in PCT/JP2014/004153 dated Nov. 11, 2014.
Non-Final Office Action of U.S. Appl. No. 14/912,815 dated Sep. 15, 2016.
Notice of Allowance of U.S. Appl. No. 14/912,815 dated Feb. 28, 2017.
Japanese Office Action dated Dec. 25, 2018 in corresponding application No. 2015-532701.
Chinese Office Action dated Apr. 15, 2019 in corresponding application No. 201480045490.5.
Japanese Office Action dated Dec. 24, 2019 for corresponding Application No. 2019-031008.
Office Action, dated Jun. 29, 2021, issued in corresponding Japanese Patent Application No. 2019-031008 (22 pages).
Office Action dated Nov. 16, 2021 issued in a corresponding Japanese Patent Application No. 2020-207470, (13 pages).

* cited by examiner

OXIDE SEMICONDUCTOR SUBSTRATE AND SCHOTTKY BARRIER DIODE

CROSS-REFERENCE TO RELATED APPLICATIONS

The present application is a continuation of U.S. patent application Ser. No. 14/912,815, filed Feb. 18, 2016, which is a U.S. National Stage Entry of International Patent Application No. PCT/JP2014/004153, filed Aug. 8, 2014, which claims the benefit of priority from Japanese Patent Application No. 2013-169966, filed Aug. 19, 2013, the entireties of which are all hereby incorporated herein by reference.

TECHNICAL FIELD

The invention relates to a schottky diode element, an electric circuit, an electric apparatus, an electronic apparatus and a vehicle including the same. Further, the invention relates to a structural body, an oxide semiconductor substrate formed of the structural body, a power semiconductor device, a diode device and a schottky barrier diode element including the same, an electric circuit, an electric apparatus, an electronic apparatus and a vehicle including the same.

BACKGROUND ART

A schottky barrier diode is a diode having rectification function utilizing an electron barrier formed in the interface of a metal and a semiconductor. As the semiconductor, Si is most commonly used (Patent Document 1, for example). Further, as a compound semiconductor having a band gap larger than that of Si, GaAs or, recently, SiC has been used (Patent Documents 2 and 3, for example).

A Si-based schottky diode is used in a high-speed switching element, a transmission/receiving mixer in a several GHz frequency band, or a frequency conversion device or the like. A GaAs-based schottky diode realizes a further higher-speed switching device, and is used in a converter, a mixer or the like for microwaves. Utilizing a wide band gap, SiC is expected to be used in an electric car, railroad, power transmission or the like in which a higher voltage is applied.

A schottky barrier diode is generally used due to its relatively low cost. However, since it has a small band gap of 1.1 eV, it is required to increase the size of the element in order to allow it to have a withstand voltage. The band gap of GaAs is 1.4 eV that is larger than that of Si and the withstand voltage of GaAs is superior to that of Si. However, epitaxial growth thereof on a Si substrate is difficult, and hence, it was difficult to obtain crystals suffering less dislocation. SiC has a wide band gap of 3.3 eV, and has a high dielectric breakdown field, and hence it is a material of which the performance is expected among other semiconductors. However, since both production of a substrate and epitaxial growth require high-temperature processes, use of SiC has problems in respect of mass productivity and cost.

RELATED ART DOCUMENTS

Patent Documents

Patent Document 1: JP-A-2009-164237
Patent Document 2: JP-A-H5-36975
Document 3: JP-A-H8-97441

SUMMARY OF INVENTION

The invention has been attained in view of the above-mentioned problems, and is aimed at providing a schottky barrier diode element having excellent current-voltage characteristics by forming, on a Si substrate, a compound semiconductor having a wide band gap at a low cost and by a method realizing excellent mass productivity.

The invention is aimed at providing an oxide semiconductor substrate that is preferable for use in a schottky barrier diode element, a diode element and a power semiconductor element.

According to the invention, the following schottky barrier diode element or the like are provided.

1. A schottky barrier diode element having a silicon (Si) substrate, an oxide semiconductor layer and a schottky electrode layer, wherein the oxide semiconductor layer comprises a polycrystalline and/or amorphous oxide semiconductor having a band gap of 3.0 eV or more and 5.6 eV or less.
2. The schottky barrier diode element according to 1, wherein the oxide semiconductor comprises one or more selected from the group consisting of In, Ti, Zn, Ga and Sn.
3. The schottky barrier diode element according to 1 or 2, wherein the oxide semiconductor layer comprises indium (In) as a main component.
4. The schottky barrier diode element according to any one of 1 to 3, wherein the atomic composition percentage of indium relative to the total metal elements contained in the oxide semiconductor layer ([In]/([In]+[total metal elements other than In])×100) is 30 to 100 atm %.
5. The schottky barrier diode element according to any one of 1 to 4, wherein the oxide semiconductor layer is formed on the silicon substrate and the schottky electrode layer is formed on the oxide semiconductor layer.
6. The schottky barrier diode element according to any one of 1 to 4, wherein the schottky electrode layer is formed on the silicon substrate and the oxide semiconductor layer is formed on the schottky electrode layer.
7. The schottky barrier diode element according to any one of 2 to 6, wherein the oxide semiconductor layer further comprises one or more elements selected from Al, Si, Zn, Ga, Hf, Zr, Ce, Sm and Sn.
8. The schottky barrier diode element according to any one of 1 to 7, wherein the carrier concentration at room temperature of the oxide semiconductor layer is $1\times10^{14}$ cm$^{-3}$ or more and $1\times10^{17}$ cm$^{-3}$ or less.
9. The schottky barrier diode element according to any one of 1 to 8, wherein an edge part of the oxide semiconductor layer is covered by an insulating film so as not to be exposed.
10. An electric circuit comprising the schottky barrier diode element according to any one of 1 to 9.
11. An electric apparatus comprising the schottky barrier diode element according to any one of 1 to 9.
12. An electronic apparatus comprising the schottky barrier diode element according to any one of 1 to 9.
13. A vehicle comprising the schottky barrier diode element according to any one of 1 to 9.
14. A structural body comprising an oxide semiconductor layer and a metal thin film, wherein
    the oxide semiconductor layer comprises polycrystalline and/or amorphous oxide semiconductor having a band gap of 3.0 eV or more and 5.6 eV or less; and
    the structural body comprises a region where the oxide semiconductor layer electrically contacts the metal thin film.
15. The structural body according to 14, wherein the oxide semiconductor comprises In as a main component.

16. The structural body according to 14 or 15, wherein the metal thin film has a work function of 4.7 eV or more.
17. The structural body according to any one of 14 to 16, wherein the oxide semiconductor is crystalline, and
at least one element selected from Al, Si, Ce, Ga, Hf, Zr and Sm is contained in an amount ratio of 3 at % or more and 30 at % or less relative to the total metal elements.
18. The structural body according to any one of 14 to 17, wherein the oxide semiconductor has a carrier concentration at room temperature of $1 \times 10^{14}$ cm$^{-3}$ or more and $1 \times 10^{17}$ cm$^{-3}$ or less.
19. The structural body according to any one of 14 to 18, wherein the film thickness of the oxide semiconductor layer is 50 nm to 20 μm.
20. An oxide semiconductor substrate in which the structural body according to any one of 14 to 19 is stacked on a conductive substrate.
21. The oxide semiconductor substrate according to 20, wherein the conductive substrate is composed of one or more selected from monocrystalline silicone, polycrystalline silicon and microcrystal silicon.
22. An oxide semiconductor substrate in which the structural body according to any one of 14 to 19 is stacked on an electrically insulating substrate.
23. A power semiconductor element in which the oxide semiconductor substrate according to any one of 20 to 22 is used.
24. A diode element in which the oxide semiconductor substrate according to any one of 20 to 22 is used.
25. A schottky barrier diode element in which the oxide semiconductor substrate according to any one of 20 to 22 is used.
26. The schottky barrier diode element according to 25, wherein the metal thin film serves as a schottky electrode layer.
27. An electric circuit comprising the power semiconductor element according to 23, the diode element according to 24 or the schottky barrier diode element according to 25 or 26.
28. An electric apparatus comprising the electric circuit according to 27.
29. An electronic apparatus comprising the electric circuit according to 27.
30. A vehicle comprising the electric circuit according to 27.

According to the invention, it is possible to provide a schottky barrier diode element having excellent current-voltage characteristics by forming on a Si substrate a compound semiconductor having a wide band gap at a low cost and by a method that is excellent in mass productivity.

Further, according to the invention, it is possible to provide an oxide semiconductor substrate that is preferable for use in a schottky barrier diode element, a diode element and a power semiconductor element.

MODE FOR CARRYING OUT THE INVENTION

1. Schottky Barrier Diode Element

Figure 1:
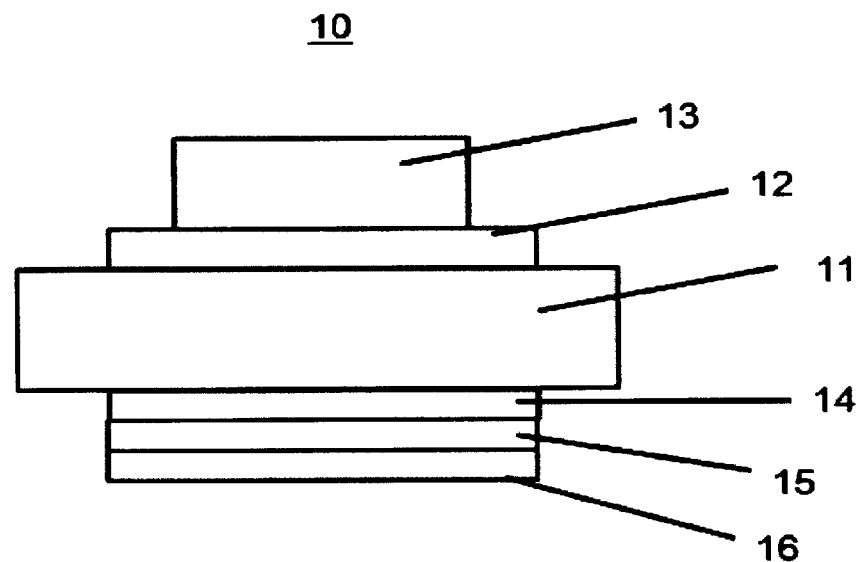
FIG. 1 is a cross-sectional view schematically showing one embodiment of the schottky barrier diode element of the invention.

The schottky barrier diode element of the invention is a schottky barrier diode element having a silicon (Si) substrate, an oxide semiconductor layer and a schottky electrode layer, wherein the oxide semiconductor layer comprises a polycrystalline and/or amorphous oxide semiconductor having a band gap of 3.0 eV or more and 5.6 eV or less. By using a polycrystalline and/or amorphous oxide semiconductor having a wide band gap, it is possible to provide a schottky barrier diode element having excellent current-voltage characteristics, in particular, a high dielectric breakdown field.

In addition, by using a material having a wide band gap, it becomes possible to use a polycrystalline and/or amorphous material instead of a monocrystal that requires a high production cost in connection with crystal growth or the like.

The band gap of the oxide semiconductor contained in the oxide semiconductor layer is preferably 3.1 eV or more and 5.4 eV or less. By using an oxide semiconductor having a band gap within this range, it is possible to provide a schottky barrier diode element having excellent current-voltage characteristics, in particular, a high dielectric breakdown field.

As an oxide semiconductor having a band gap of 3.0 eV or more and 5.6 eV or less, an oxide containing one or more selected from the group consisting of In, Ti, Zn, Ga and Sn can be given. For example, $In_2O_3$, $TiO_2$, ZnO, $Ga_2O_3$, SnO or the like can be given.

It is preferred that the oxide semiconductor contained in the oxide semiconductor layer be one or more selected from the group consisting of $In_2O_3$, $TiO_2$, ZnO, $Ga_2O_3$ and SnO. For example, one obtained by solid solution of Ti, Zn, Ga or Sn in $In_2O_3$, a composite oxide of In and Ti, Zn, Ga or Sn or an amorphous oxide containing these elements at a prescribed atomic ratio are included. Further, conductivity of the oxide semiconductor may be adjusted by appropriately doping with impurities. For example, in respect of performance (sintering density, transverse strength, etc.), it is preferred that the oxide semiconductor comprise $In_2O_3$ as a main component.

These oxide semiconductors may be polycrystalline, amorphous or may be a mixture of a polycrystalline oxide and an amorphous oxide.

The band gap can be calculated by the following method. That is, on a transparent substrate such as a glass substrate, a 300 nm-thick oxide semiconductor thin film is formed by sputtering. Then, by means of a UV-VIS spectrophotometer (UV-3100, manufactured by Shimadzu Corporation, for example), transmittance within a range of 250 nm to 1000 nm is measured. Subsequently, for the obtained transmittance, hv [eV] is plotted on the x-axis and $(\alpha h v)^{1/2} [(eV^{1/2})(cm^{-1/2})]$ is plotted on the y-axis (Tauc plot).

Here, h is a Planck coefficient [J·s], v is a frequency [s$^{-1}$], and α is an absorption coefficient [cm$^{-1}$]. Subsequently, by extrapolating the linear part to the x-axis to obtain an intersection, a band gap of the oxide semiconductor thin film can be obtained.

When an oxide thin film is present on a colored substrate or in a diode substrate, calculation can be conducted similarly by evaluating the spectrum of reflectance after the film surface is exposed.

It is preferred that the oxide semiconductor layer comprise indium (In) as a main component.

The "oxide semiconductor layer comprises indium (In) as a main component" as referred to herein means that the atomic percentage of indium to total metal elements contained in the oxide semiconductor layer ([In]/([In]+[total metal elements other than In])×100) be 30 to 100 atm %. By using a material based on indium oxide having a large band gap, it is possible to provide a schottky barrier diode element having excellent current-voltage characteristics, in particular, a high dielectric breakdown field.

The amount ratio of indium in the oxide semiconductor layer can be adjusted by changing the amount ratio of indium in a sputtering target, for example. The same can be applied to other elements.

It is preferred that the amount of indium contained in the oxide semiconductor layer be 30 atm % or more relative to the total metal elements contained in the oxide semiconductor layer. With this amount range, high withstand voltage and conductivity can be attained at the same time.

The composition ratio of the elements contained in the oxide semiconductor layer can be obtained by a quantitative analysis using secondary ion mass spectrometry (SIMS). Specifically, after exposing the cross section of the semiconductor layer by a method such as polishing, a quantitative analysis is conducted by a calibration curve method by using a standard sample of which the concentration is known.

When a film is formed by a sputtering method, the elemental composition ratio of the oxide semiconductor layer is almost equal to the elemental composition ratio of a sputtering target.

The elemental compositional ratio of a sputtering target is obtained by a quantitative analysis by means of an inductively coupled plasma mass spectrometry (ICP-AES) apparatus. Specifically, the quantity of a sample solution obtained by dissolving a sputtering target with an acid treatment is determined by a calibration method by using a standard sample having a known concentration. By converting the concentration of the resulting solution into an atomic percentage of the target, the elemental composition ratio of the target can be obtained.

The oxide semiconductor layer may further contain one or more elements selected from Al, Si, Zn, Ga, Hf, Zr, Ce, Sm and Sn. That is, the oxide semiconductor layer is composed of indium oxide ($In_2O_3$) and, optionally, an oxide of an added element. No specific restrictions are imposed on an oxide of the added element.

The added element is preferably one or more elements selected from Al, Si, Zn, Ga, Hf, Ce, Sm and Sn.

The oxide semiconductor layer is not necessarily monocrystalline. It may be amorphous or polycrystalline.

However, in order to allow the oxide semiconductor layer to exhibit excellent diode characteristics, the carrier concentration thereof at room temperature (298K) is preferably $1\times10^{14}$ $cm^{-3}$ or more and $1\times10^{17}$ $cm^{-3}$ or less. If the carrier concentration is less than $1\times10^{14}$ $cm^{-3}$, the on-resistance becomes too high, and as a result, undesirable heat generation may occur at the time of operation. If the carrier concentration exceeds $1\times10^{17}$ $cm^{-3}$, the resistance becomes too low, and leakage current at the time of applying a reverse bias voltage may increase.

The carrier concentration is more preferably $1\times10^{15}$ $cm^{-3}$ or more and $5\times10^{16}$ $cm^{-3}$ or less.

The carrier concentration is measured by the method described in the Examples.

The preferable concentration of the added element other than indium differs by the application of the oxide semiconductor layer; i.e. it differs between a case when the layer is used as a crystalline semiconductor and a case when the layer is used as an amorphous semiconductor. In the case of a crystal semiconductor, relative to crystals of indium oxide, Al, Si, Ga, Hf, Zr, Ce and Sm is 3 at % or more and 30 at % or less relative to total metal elements containing In and Zn is 5 at % or more and 40 at % or less relative to total metal elements containing In. In addition, Sn is effective to lower the resistance of the target, and is preferably contained in an amount of 500 ppm or more and 3 at % or less relative to the total metal elements containing In. Sn serves as a donor for crystalline indium oxide and hence it is preferred that the amount thereof not exceed 3 at %.

In the case of an amorphous semiconductor, as a conventionally known composition, a three-component system such as IGZO111, ITZO, IZZrO, IZAIO or the like and a two-component system such as IGO, IZO, ITO or the like can be used. In this case, the concentration of In is less than 90%, the annealing temperature is preferably suppressed to 300° C. or less.

In this case, it is preferred that the carrier concentration be adjusted such that it is within a range of $1\times10^{14}$ $cm^{-3}$ or more and $1\times10^{17}$ $cm^{-3}$ or less by annealing in an oxidizing atmosphere.

As for a silicon (Si) substrate, either an n-type silicon substrate or a p-type silicon substrate can be used. As for the silicon substrate, a conventionally known substrate having excellent surface smoothness such as a silicon monocrystal substrate, a silicon polycrystalline substrate and a silicon fine crystal substrate can be used.

One morphology of a polycrystal is a fine crystal. A polycrystal is an assembly of monocrystals, and has a clear grain boundary that often affects electric characteristics. Among polycrystals, a fine crystal has a grain size of on the level of submicron or less, and does not have a clear grain boundary. Therefore, it has an advantage that variations in electric characteristics by grain boundary scattering are small.

In a schottky electrode layer, a material having a work function of 4.7 eV or more is preferably used. Specifically, Ru, Au, Pd, Ni, Ir, Pt or alloys thereof are used. If the work function is below 4.7 eV, the schottky barrier height is short, whereby the amount of leakage at the time of applying a reverse bias voltage may become large.

Although varied depending on the concentration of impurities of silicon wafer, the work function of a metal used in an ohmic electrode layer is preferably about 4.1 eV. Taking the adhesiveness into consideration, Ti or Mo is preferable.

The measurement of work function can be conducted by a method mentioned later.

In one embodiment of the schottky barrier diode element of the invention, an oxide semiconductor layer is formed on a silicon substrate, and a schottky electrode layer is formed on the oxide semiconductor layer.

When n-type silicon wafer is used, an oxide semiconductor layer is stacked on the surface of the substrate, and on the oxide semiconductor layer, an electrode layer (Pt, Au, Pd, Ni or the like) forming the schottky is arranged. On the backside of the substrate, an electrode layer (e.g. Ti) that forms ohmic contact with n-type silicon is stacked. In order to ensure conduction, on the backside of the substrate, it is preferable to stack a good conductor such as Au with Ni being disposed. Ni has effects of preventing diffusion of Au.

In another embodiment of the schottky barrier diode element of the invention, a schottky electrode layer is formed on the silicon substrate, and on the schottky electrode layer, an oxide semiconductor layer is formed.

When p-type silicon wafer is used, on the surface of the substrate, a schottky electrode layer such as Pt, Au, Pd and Ni is stacked. On the schottky electrode layer, an oxide semiconductor layer is formed by a sputtering method. In this case, a schottky barrier is formed in the interface between a metal such as Pt, Au, Pd and Ni and the oxide semiconductor layer. Further, by subjecting the surface of the schottky electrode layer to an acidification treatment by oxygen plasma or UV ozone before forming the oxide semiconductor layer, more excellent diode characteristics can be obtained.

Subsequently, on the oxide semiconductor layer, a metal that forms ohmic contact with the oxide semiconductor (e.g. Ti) is stacked. In this case, as mentioned above, a good conductor such as Au may be further stacked with Ni being disposed. On the other hand, on the backside of the p-type silicon wafer, an electrode having good adhesiveness is stacked in order to assist conductance.

The schottky barrier diode element of the invention may have a conventionally known guard ring structure. A guard ring is stacked between the oxide semiconductor layer and the schottky electrode layer, and has an effect of improving withstand voltage. At an end part (edge part) of the oxide semiconductor layer, an electrical field tends to occur to cause dielectric breakdown. Therefore, by stacking an insulating film such as $SiO_2$ so as to cover this end part, withstand voltage (dielectric breakdown voltage) can be further increased.

It is preferred that the schottky barrier diode element of the invention be covered by an insulating film such that the edge part of the oxide semiconductor layer is not exposed.

The oxide semiconductor layer, the schottky electrode layer, the ohmic electrode layer or the like that constitute the schottky barrier diode element of the invention can be formed by a conventionally known sputtering film forming method that is low in cost and has excellent mass productivity, as described in the Examples.

The film thickness of the oxide semiconductor layer is the same as that of the oxide semiconductor layer in the structural body of the invention, as described below.

In the interface between the electrode layer and the oxide semiconductor layer forming the schottky electrode, oxygen is introduced during the schottky electrode sputtering process to conduct reactive sputtering, whereby a thin oxide film having a thickness of 10 nm or less may be stacked.

After forming the oxide semiconductor layer, the layer may be subjected to an annealing process to crystallize the oxide semiconductor. By crystallizing the oxide semiconductor, the on-resistance can be decreased. No specific restrictions are imposed on the annealing process. However, for example, after forming the oxide semiconductor layer, a treatment is conducted at 300° C. for 2 hours in the air to stabilize the oxidized state. Then, after forming an electrode layer, a treatment is conducted at 200° C. for 1 hour in the air. The crystallization can be confirmed by X-ray diffraction (XRD) measurement.

The schottky barrier diode element of the invention has a high dielectric breakdown field. The dielectric breakdown field of the schottky barrier diode of the invention is preferably 0.5 MV/cm or more, more preferably 0.7 MV/cm or more. By this dielectric breakdown field, the diode can be designed into a thin diode. As a result, the size of the element can be reduced, whereby heat dissipation can be conducted advantageously. The n value of the schottky barrier diode of the invention is preferably 2 or less, more preferably 1.5 or less. By this n value, the on-resistance is reduced, and as a result, heat generation can be suppressed.

The dielectric breakdown field and the n value are measured by the method described in the Examples.

The schottky barrier diode element of the invention can preferably be used in an electric circuit, an electric apparatus, an electronic apparatus, a vehicle and a motor vehicle.

2. Structural Body and Oxide Semiconductor Substrate

The structural body of the invention comprises an oxide semiconductor layer and a metal thin film, and comprises a region where the oxide semiconductor layer and the metal thin film electrically contact. The oxide semiconductor layer comprises polycrystalline and/or amorphous oxide semiconductor having a band gap of 3.0 eV or more and 5.6 eV or less.

The "oxide semiconductor layer and the metal film electrically contact" means that the metal thin film and the oxide semiconductor layer form a junction, and means a state in which electrons can be freely diffused from the oxide semiconductor to the metal thin film such that the Fermi energies of the both coincident with each other. As for the "region where the oxide semiconductor layer and the metal thin film electrically contact", a region where the metal thin film and the oxide semiconductor layer are directly contacted without interposition of an insulating film can be given.

It is preferred that the metal thin film have a work function of 4.7 eV or more.

As the metal thin film having a work function of 4.7 eV or more, a metal such as Au, Cr, Cu, Fe, Ir, Mo, Nb, Ni, Pd, Pt, Re, Ru and W and a metal oxide such as $In_2O_3$, ITO and IZO can be given. In respect of obtaining clear rectification properties, it is advantageous to use a metal having a larger work function and having a high carrier concentration. A more preferable range of the work function is 4.8 eV or more, further preferably 5.0 eV or more. Although no specific restrictions are imposed on the upper limit, the upper limit is preferably 5.6 eV or less.

When a metal oxide is used as a metal thin film, it is preferred that the carrier concentration be $10^{20}$ cm$^{-3}$ or more. If the carrier concentration is smaller than this range, when stacking on the metal film an oxide semiconductor comprising In as a main component, the degree of spreading of a depletion layer is increased, whereby an increase in internal resistance occurs or high-speed switching properties are adversely affected. Therefore, as a material for a metal thin film stacked on the oxide semiconductor comprising In as a main component, Au, Ir, Ni, Pd or W is more preferable.

In order to increase processability, a slight amount of a metal may be added in such an amount that does not lower the work function. For example, when the material of the metal thin film is Au, an alloy formed by adding Ag and Cu can be used. If the material of the metal thin film is Pd, an alloy formed of adding Ag and Cu can be used.

The work function is measured by means of a photoelectron spectrometer (AC-3 manufactured by Riken Keiki Co., Ltd., for example). The work function varies depending on a surface treatment with an acid, an alkali or the like or a UV washing or the like. The work function as referred to herein means a value that is obtained by a measurement without conducting a treatment after film formation.

It is preferred that the above-mentioned oxide semiconductor comprise In as a main component. The "comprises In as a main component" as referred to herein is as explained above with reference to the schottky barrier diode element of the invention. As for the band gap, the same as mentioned above with reference to the schttoky barrier diode element of the invention can be applied.

The above-mentioned oxide semiconductors may be polycrystalline, amorphous, or may be a mixture of polycrystalline semiconductors and amorphous semiconductors. It is preferred that the oxide semiconductor be crystalline.

It is preferred that at least one element selected from Al, Si, Ce, Ga, Hf, Zr and Sm be contained in the oxide semiconductor. The content thereof is preferably 3 at % or more and 30 at % or less relative to the total metal elements of the oxide semiconductor.

It is preferred that the oxide semiconductor mentioned above have a carrier concentration of $1 \times 10^{14}$ cm$^{-3}$ or more and $1 \times 10^{17}$ cm$^{-3}$ or less at room temperature (298K). The carrier concentration is more preferably $1 \times 10^{15}$ cm$^{-3}$ or more and $5 \times 10^{16}$ cm$^{-3}$ or less.

A carrier concentration of less than $1 \times 10^{14}$ cm$^{-3}$ is not preferable, since when it is used as a diode elements, the on-resistance is increased too high, and heat generation may occur during operation. When the carrier concentration exceeds $1 \times 10^{17}$ cm$^{-3}$, the resistance becomes too low, and leakage current during reverse bias may increase.

As for the thin film forming technology, a CVD method such as a thermal CVD method, a CAT-CVD method, a photo-CVD method, a mist CVD method, an MO-CVD method and a plasma CVD method; a film-forming method with atomic layer level control such as MBE and ALD; a PVD method such as ion plating, ion beam sputtering and magnetron sputtering; a method in which a conventionally known ceramic process is used such as a doctor blading method, an injection method, an extrusion method, a heat pressing method, a sol-gel method and an aerosol deposition method; and a wet method such as a coating method, a spin coating method, a printing method, a spray method, an electrodeposition method, a plating method, a micellar electrolysis method can be used.

The dielectric breakdown field of the structural body of the invention is 0.5 to 3 MV/cm that is significantly superior to a conventional silicon-based diode. The required withstand voltage varies according to the application and the purpose, and 0.2 μm to 1.2 μm is required for a 60V withstand voltage, 2 μm to 12 μm is required for a 600V withstand voltage. In particular, when a film thickness of 2 μm or more is required, it is advantageous in respect of productivity process to use a CVD method or a wet method as compared with a PVD method.

The film thickness of the oxide semiconductor is preferably 50 nm or more and 20 μm or less. If the film thickness is below 50 nm, the withstand voltage becomes about 10V, that is insufficient as a dielectric breakdown voltage in many applications. If the film thickness exceeds 20 μm, a withstand voltage of 5000V can be realized. However, in this case, the on-resistance is increased, heat generation may occur at the time of switching. A more preferable range of the film thickness is 200 nm or more and 12 μm or less.

These film thicknesses can be measured by a contact type differential transformer such as a surfcoder and DEKTAK or an electron microscope such as TEM and SEM.

The structural body of the invention can preferably be used as an oxide semiconductor substrate by stacking on a conductive substrate or an electrically insulating substrate.

The oxide semiconductor substrate of the invention has rectification properties, and can preferably be used for producing a schottky barrier diode element, a power semiconductor element and a diode element. That is, it is an effective intermediate.

When used as the schottky barrier diode element, in the structural body of the invention, the metal thin film functions as the schottky electrode layer, the oxide semiconductor layer that electrically contacts the metal thin film functions as an oxide semiconductor layer.

In the oxide semiconductor substrate of the invention, the structural body may be stacked either on the conductive and/or electrically insulating substrate. In respect of excellent heat dissipation, use of a conductive substrate is advantageous.

As the conductive substrate, a conventionally known substrate excellent in surface smoothness such as a silicon monocrystal substrate, a silicon polycrystalline substrate, a silicon fine crystal substrate or the like can be used.

One form of polycrystal is fine crystal. A polycrystal is an assembly of monocrystals, and a clear boundary is present, that often affects electrical properties. Among them, fine crystals have a grain size of on the level of submicron or less, and a clear boundary is not present. For this reason, it has an advantage that variations in electric properties due to scattering in grain boundary are small.

The properties required for the oxide semiconductor substrate of the invention are surface smoothness. If used in the vertical direction, conductivity is also required. One that can realize these conditions at a low cost is a silicon substrate, although silicon is not essential. A metal such as Cu, Al, Mo, W, Ni, Cr, Fe, Nd, Au, Ag, Nd and Pd and alloys thereof can be used. In particular, if a metal material having high thermal conductance is used, effects of heat dissipation can be expected. According to need, it may have a heat sink structure. Further, a substrate formed of compound monocrystal wafer such as GaAs and InP and various oxides, nitrides, carbides or the like such as $Al_2O_3$, ZnO, MgO, $SrTiO_3$, YSZ, lanthanum aluminate, $Y_3Al_5O_{12}$, $NdGaO_3$, sapphire, AlN, GaN, SiC, alkaline-free glass and soda lime glass can be used. When used in lateral direction, the substrate may be insulative.

The vertical direction means that electric current passes in the vertical direction relative to the film surface of the oxide semiconductor. The lateral direction means that electric current passes in the horizontal direction relative to the film surface of the oxide semiconductor.

As the electrically insulating substrate, in addition to glass, a substrate of a resin such as polycarbonate, polyarylate, polyethylene terephthalate, polyether sulfone, polyimide, a phenol resin or the like can be used. Since the structural body of the invention does not need processing at high temperatures, a power source or the like of a circuit for driving a display such as a liquid crystal display or an organic EL display and a display can be mounted on the same substrate.

The oxide semiconductor substrate of the invention can preferably be used in each of a power semiconductor element, a diode element and a schottky barrier diode element. An electric circuit that comprises one or more of the power semiconductor element, the diode element and the schottky barrier diode element is preferably used in each of an electric apparatus, an electronic apparatus and an electric vehicle.

The invention provides a stacked body that is preferable for use as a member constituting a power semiconductor element, specifically, a diode element or an IGBT (insulated gate bipolar transistor) element, MOSFET (metal oxide semiconductor field effect transistor). In particular, as for the diode element, a schottky barrier diode element, a PN diode element and a PIN diode element can be preferably provided.

Here, as the type of the diode, a rectification diode used in a power source circuit, a first recovery diode used in a PWM type inverter circuit or the like, it is possible to suppress heat generation, whereby power consumption can be decreased. In particular, an inverter circuit has a high operation frequency, and hence, a short recovery time at the time of switching is required. In this respect, as compared with the conventional first recovery diode, not only it has a small film thickness, but also it is of unipolar. Therefore, the recovery time can be significantly shortened. Accordingly, if the operational frequency is high, it is possible to take most of the characteristics of the diode of the invention.

For the invertor circuit for a vehicle, conventionally, GTO (Gate Turn-Off thyristor) had been used. GTO is suited for switching of large power, the frequency is about 500 Hz. Therefore, noises generated at the time of moving posed a problem. Therefore, in many of vehicles or EVs that had become available in recent years, IGBT has been mounted. The switching speed of IGBT can be increased to several 10 kHz. As a result, it is possible to suppress generation of noises, and also to reduce the size of peripheral members.

In principle, IGBT has small switching loss. However, since it has high operation frequency, reducing the leakage current in reverse direction of a first recovery diode used in combination has great effects on reduction of power consumption. Therefore, the diode of the invention having small leakage current in a reverse direction as compared with conventional Si diodes is particularly effective as a first recovery diode used in an IGBT inverter. Therefore, when a further smooth operation is required by increasing the operation frequency, advantageous effects are further increased. Further, since heat generation can be suppressed, cooling mechanism can be simplified. For example, in the case of EV, it has effects of integrating a plurality of cooling mechanisms that were conventionally required by means of a radiator of 110° C.

EXAMPLES

Hereinbelow, the Examples of the invention will be explained with reference to the drawings.

Example 1

FIG. 1 is a cross-sectional view schematically showing the schottky barrier diode element obtained in Example 1.

First, an n-type silicon (Si) substrate 11 having a resistivity of 0.02 Ω·cm was prepared. By treating with dilute hydrofluoric acid, a naturally oxidized film formed on the surface of the substrate was removed. This Si substrate was mounted in a sputtering apparatus (HSM552, manufactured by Shimadzu Corporation). By using a sintered body having a composition of $In_2O_3:Ga_2O_3=95:5$ (wt. %) as a sputtering target, sputtering discharge was caused to occur under conditions of RF100W. As a result, on the surface of the Si substrate from which the oxidized film had been removed, a 300 nm-thick oxidized film (IGO film) 12 containing indium and gallium was formed.

The substrate 11 also functions as a contact electrode.

Subsequently, this IGO film was patterned by photolithography, thereby to form a desired pattern. In the air, annealing was conducted at 300° C. for 2 hours, whereby an IGO film was crystallized. The crystal state of the IGO film was confirmed by an XRD measurement, and as a result, it was revealed that the IGO film was polycrystalline.

The Si substrate with this polycrystalline IGO film was again mounted in a sputtering apparatus, and film formation by sputtering was conducted by using a Pt target. As a result, a Pt electrode 13 was formed on the polycrystalline IGO film, whereby a schottky junction was obtained.

Subsequently, this substrate was again immersed in dilute hydrofluoric acid to remove a naturally oxidized film formed on the backside of the substrate on which no polycrystalline IGO film was not formed. Films were formed by sputtering in the order of a Ti layer 14, a Ni layer 15 and an Au layer 16, whereby an ohmic electrode was formed. Finally, a stacked body obtained by forming the ohmic electrode was subjected to annealing in the air at 200° C. for 1 hour, whereby a schottky barrier diode element 10 was obtained.

In order to confirm the carrier concentration of the IGO film at room temperature, CV (capacitance-voltage) measurement was conducted. The capacitance C [F/cm²] of a depletion layer per unit area is expressed as C=ε/W. Here, E is the dielectric constant [F/cm] of a semiconductor and W is the width [cm] of a depletion layer. When a forwardly-directed bias voltage V [V] is applied to the schottky diode, the width of the depletion layer is $W=\{2\varepsilon(\varphi-V)/qN\}(\frac{1}{2})$. Therefore, $C=\{q\varepsilon N/2(\varphi-V)\}(\frac{1}{2})$. Here, q is an elementary charge (=1.6×10⁻¹⁹ [C]) and φ is a built-in potential [V], showing difference in contact difference potential between the Pt electrode and the IGO film.

After obtaining CV measurement results, $C^{-2}$–V characteristics are plotted, and a doping concentration (=carrier concentration) N can be obtained from the gradient. As a result, the following was revealed. That is, the IGO film after forming by sputtering had a low resistance and the depletion layer was not widened, but after annealing in the air at 300° C. for 2 hours, CV measurement was possible. As a result of calculation from the gradient of $C^{-2}$–V, the carrier concentration was found to be 5×10¹⁵ cm⁻³.

The current-voltage characteristics of the resulting schottky barrier diode element were measured to obtain an n-value and a reverse withstand voltage. Here, the n-value is a parameter showing the characteristics of the schottky barrier diode element as shown by the following formula (1). As n becomes closer to 1, ideal device characteristics can be obtained.

$$I=I_0[\exp(V/nkT)] \quad (1)$$

I: Density of total currents flowing from the oxidized film towards the Si substrate [A/cm²]
e: Charges of electrons 1.60×10⁻¹⁹ [C]
V: Voltage [V] to be applied to element
$I_0$: Current density [A/cm²] when the voltage V applied to the element is 0V.
k: Boltzmann constant 1.38×10⁻²³ [J/K]
T: Temperature [K]

As a result, it was found that the n value was 1.3 and the reverse withstand voltage was 20V. This reverse withstand voltage corresponds to a dielectric breakdown field of 0.67 MV/cm, and is twice as high as that of a conventional schottky barrier diode obtained by using monocrystalline Si. The reverse withstand voltage and the dielectric breakdown field have the following relationship:

Reverse withstand voltage (V)=Dielectric breakdown field (V/cm)×Semiconductor film thickness (cm)

The results obtained above are shown in Table 1. The "forwardly-directed voltage" shown in the table means a voltage required for allowing current of 0.1 mA/cm² to pass through the element, and the "on-current density" is a current density when a voltage of 10V is applied to the element.

Examples 2 to 9

As shown in Table 1, by using a sputtering method, schottky barrier diode elements were prepared and evaluated in the same manner as in Example 1 while changing the compositions of the schottky electrode and the semiconductor. The results are shown in Table 1.

Example 10

Figure 2:
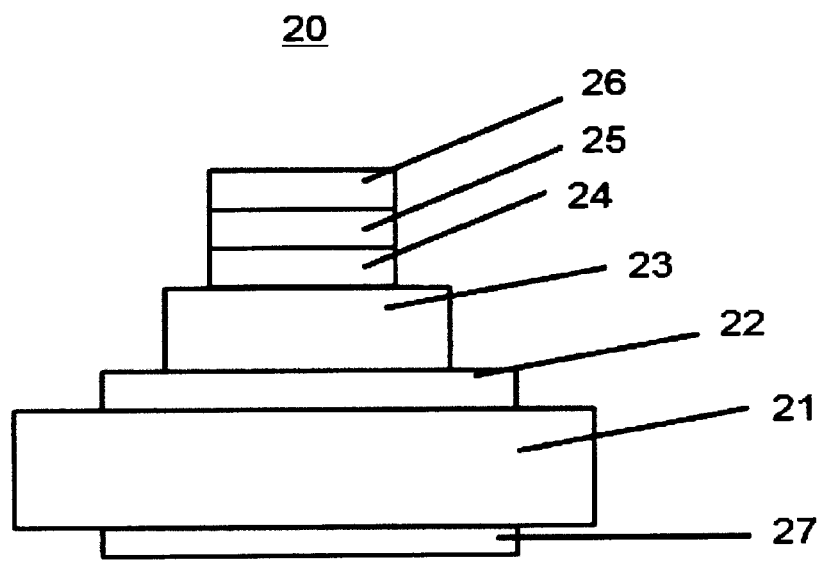
FIG. 2 is a cross-sectional view schematically showing one embodiment of the schottky barrier diode element of the invention.

FIG. 2 is a cross-sectional view showing the schottky barrier diode element obtained in Example 10.

First, a p-type silicon substrate 21 having a resistivity of 0.02 Ω·cm was prepared. A naturally oxidized film was removed by dilute hydrofluoric acid, and film formation was conducted by sputtering by using a Pd target, whereby a Pd electrode 22 was formed. Subsequently, the surface of this Pd electrode was subjected to an oxidizing treatment with UV ozone. Then, in the same manner as in Example 1, an IGO film 23 was formed by sputtering. The film was subjected to annealing in the air at 300° C. for 1 hour. Films were formed by sputtering in the order of a Ti layer 24, a Ni layer 25 and an Au layer 26, whereby an ohmic electrode was formed.

For the backside of the p-type silicon substrate (on the surface opposite to the surface on which the Pd electrode was formed), after removing a naturally oxidized film with dilute hydrofluoric acid, a TiAl film 27 was formed by sputtering by using a TiAl alloy as a target. Finally, annealing was conducted in the air at 200° C. for 1 hour, whereby a schottky barrier diode element 20 was obtained. This diode had a polarity reverse to that of the diodes obtained in Examples 1 to 9. When p-type silicon wafer side is connected to plus, current flows in the forward direction, and when p-type silicon wafer side is connected to minus, current flows in the reverse direction.

The thus obtained element was evaluated in the same manner as in Example 1. The results are shown in Table 1.

Example 11

Figure 3:
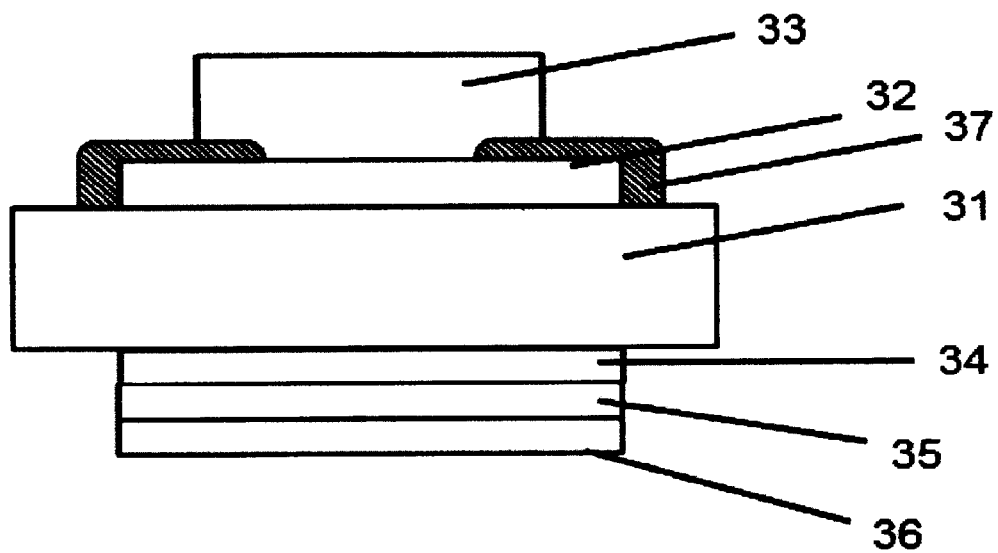
FIG. 3 is a cross-sectional view schematically showing one embodiment of the schottky barrier diode element of the invention.

FIG. 3 is a cross-sectional view schematically showing the schottky barrier diode element obtained in Example 11.

In the same manner as in Example 1, an IGO film 32 as an oxide semiconductor was formed by sputtering on an n-type silicon substrate 31. After annealing the film in the air at 300° C. for 1 hour, a negative resist (manufactured by AZ Electronic Material Co., Ltd.) was applied by spin coating. By prebaking, exposure, development and post baking, a ring-like pattern was formed in an edge part of the IGO film. Subsequently, the film was mounted in a sputtering apparatus, and by using $SiO_2$ as a target, film formation was conducted by sputtering at RF of 100 W for 50 minutes, whereby a 50 nm-thick $SiO_2$ film was formed. Subsequently, the film was immersed in a photoresist stripper, and an unnecessary part of the photoresist was peeled off together with the IGO film. In this way, a guard ring 37 of the IGO film was formed. Hereinafter, in the same manner as in Example 1, a Pt electrode 33 and an ohmic electrode of Ti34, Ni35 and Au36 were formed, whereby a schottky diode electrode 30 provided with a guard ring was prepared.

The obtained element was evaluated in the same manner as in Example 1. The results are shown in Table 1. Due to the effect of a guard ring, the element exhibited further excellent withstand voltage properties than those obtained in Example 1.

TABLE 1

|  | Ex. 1 | Ex. 2 | Ex. 3 | Ex. 4 |
| --- | --- | --- | --- | --- |
| Schottky electrode | Pt | Au | Pd | Ru |
| Work function (eV) of Schottky electrode | 5.6 | 5.1 | 5.5 | 4.7 |
| Substrate | Si wafer (n type) | Si wafer (n type) | Si wafer (n type) | Si wafer (n type) |
| Top electrode | Pt | Au | Pd | Ru |
| Contact electrode | Si | Si | Si | Si |
| Ohmic elecrode | Ti/Ni/Au | Ti/Ni/Au | Ti/Ni/Au | Ti/Ni/Au |
| Work function (eV) of ohmic electrode | 4.1 | 4.1 | 4.1 | 4.1 |
| Semiconductor composition (wt %) | $In_2O_3:Ga_2O_3$ = 95:5 | $In_2O_3:ZnO$ = 95:5 | $In_2O_3:SiO_2$ = 95:5 | $In_2O_3:Al_2O_3$ = 95:5 |
| Composition of semiconductor (at %) | In:Ga = 92.8:7.2 | In:Zn = 91.8:8.2 | In:Si = 89.2:10.8 | In:Al = 87.5:12.5 |
| Film thickness of semiconductor (nm) | 300 | 300 | 300 | 300 |
| Annealing conditions after formation of semiconductor film | In the air, 300° C., 2 h | In the air, 300° C., 2 h | In the air, 300° C., 2 h | In the air, 300° C., 2 h |
| Final annealing conditions | In the air, 200° C., 1 h | In the air, 200° C., 1 h | In the air, 200° C., 1 h | In the air, 200° C., 1 h |
| Band gap (eV) of oxide semiconductor film | 3.3 | 3.2 | 3.2 | 3.5 |
| Carrier concentration ($cm^{-3}$) | $5 \times 10^{15}$ | $2 \times 10^{16}$ | $1 \times 10^{15}$ | $1 \times 10^{14}$ |
| n value | 1.3 | 1.3 | 1.3 | 1.3 |
| Dielectric breakdown field (MV/cm) | 0.67 | 0.5 | 0.7 | 0.8 |
| Results of XRD measurement of semiconductor | Polycrystalline | Polycrystalline | Polycrystalline | Polycrystalline |
| Forwardly-directed voltage (V) | 0.8 | 0.9 | 0.9 | 0.9 |
| On-current density (A/cm²) | >10 | >10 | >10 | >10 |

TABLE 1-continued

|  | Ex. 5 | Ex. 6 | Ex. 7 | Ex. 8 |
|---|---|---|---|---|
| Schottky electrode | Ni | Pt | Pt | Pt |
| Work function (eV) of Schottky electrode | 5.1 | 5.6 | 5.6 | 5.6 |
| Substrate | Si wafer (n type) | Si wafer (n type) | Si wafer (n type) | Si wafer (n type) |
| Top electrode | Ni | Pt | Pt | Pt |
| Contact electrode | Si | Si | Si | Si |
| Ohmic elecrode | Ti/Ni/Au | Ti/Ni/Au | Ti/Ni/Au | Ti/Ni/Au |
| Work function (eV) of ohmic electrode | 4.1 | 4.1 | 4.1 | 4.1 |
| Semiconductor composition (wt %) | $In_2O_3:HfO_2$ = 95:5 | $In_2O_3:CeO_2$ = 95:5 | $In_2O_3:Sm_2O_3$ = 95:5 | $In_2O_3:Ga_2O_3:ZnO$ = 25:35:40 |
| Composition of semiconductor (at %) | In:Hf = 96.6:3.4 | In:Ce = 95.9:4.1 | In:Sm = 96.0:4.0 | In:Ga:Zn = 17.2:35.7:47.0 |
| Film thickness of semiconductor (nm) | 300 | 300 | 300 | 300 |
| Annealing conditions after formation of semiconductor film | In the air, 300° C., 2 h | In the air, 300° C., 2 h | In the air, 300° C., 2 h | In the air, 300° C., 2 h |
| Final annealing conditions | In the air, 200° C., 1 h | In the air, 200° C., 1 h | In the air, 200° C., 1 h | In the air, 200° C., 1 h |
| Band gap (eV) of oxide semiconductor film | 3.6 | 3.6 | 3.5 | 3.3 |
| Carrier concentration ($cm^{-3}$) | $1 \times 10^{15}$ | $1 \times 10^{15}$ | $2 \times 10^{15}$ | $1 \times 10^{15}$ |
| n value | 1.3 | 1.3 | 1.3 | 1.3 |
| Dielectric breakdown field (MV/cm) | 0.7 | 0.67 | 0.67 | 0.67 |
| Results of XRD measurement of semiconductor | Polycrystalline | Polycrystalline | Polycrystalline | Amorphous |
| Forwardly-directed voltage (V) | 0.9 | 0.8 | 0.8 | 1.3 |
| On-current density ($A/cm^2$) | >10 | >10 | >10 | >10 |

|  | Ex. 9 | Ex. 10 | Ex. 11 |
|---|---|---|---|
| Schottky electrode | Pt | Pd | Pt |
| Work function (eV) of Schottky electrode | 5.6 | 5.5 | 5.6 |
| Substrate | Si wafer (n type) | Si wafer (p type) | Si wafer (n type) |
| Top electrode | Pt | TiAl | Pt |
| Contact electrode | Si | Si | Si |
| Ohmic elecrode | Ti/Ni/Au | Ti/Ni/Au | Ti/Ni/Au |
| Work function (eV) of ohmic electrode | 4.1 | 5 | 4.1 |
| Semiconductor composition (wt %) | $In_2O_3:SnO_2:ZnO$ = 45:20:35 | $In_2O_3:Ga_2O_3$ = 95:5 | $In_2O_3:Ga_2O_3$ = 95:5 |
| Composition of semiconductor (at %) | In:Sn:Zn = 31.8:26.0:42.2 | In:Ga = 92.8:7.2 | In:Ga = 92.8:7.2 |
| Film thickness of semiconductor (nm) | 300 | 300 | 300 |
| Annealing conditions after formation of semiconductor film | In the air, 300° C., 2 h | In the air, 300° C., 2 h | In the air, 300° C., 2 h |
| Final annealing conditions | In the air, 200° C., 1 h | In the air, 200° C., 1 h | In the air, 200° C., 1 h |
| Band gap (eV) of oxide semiconductor film | 3.0 | 3.3 | 3.4 |
| Carrier concentration ($cm^{-3}$) | $1 \times 10^{17}$ | $5 \times 10^{15}$ | $3 \times 10^{15}$ |
| n value | 1.3 | 1.3 | 1.2 |
| Dielectric breakdown field (MV/cm) | 0.4 | 0.67 | 0.85 |
| Results of XRD measurement of semiconductor | Amorphous | Polycrystalline | Polycrystalline |
| Forwardly-directed voltage (V) | 1.3 | 1.2 | 1.2 |
| On-current density ($A/cm^2$) | >10 | >10 | >10 |

Example 12

An n-type silicon (Si) substrate having a resistivity of 0.02 Ω·cm was prepared. By treating with dilute hydrofluoric acid, a naturally oxidized film formed on the surface of the substrate was removed. This Si substrate was mounted in a sputtering apparatus (HSM552, manufactured by Shimadzu Corporation). First, Ti was formed as an ohmic electrode. Subsequently, by using a sintered body having a composition of $In_2O_3:Ga_2O_3$=78:22 (wt. %) as a sputtering target, sputtering discharge was conducted at RF of 100 W. As a result, on the Ti layer formed on the Si substrate, a 1 μm-thick oxidized film (IGO film) containing indium and gallium was formed.

Subsequently, the IGO film was subjected to annealing in the air at 300° C. for 1 hour. Then, patterning was conducted by photolithography to obtain a desired pattern. Then, annealing was conducted in the air at 300° C. for 1 hour. As a result of evaluating the IGO film by XRD, no crystalline peak was observed. It was confirmed that the film was amorphous.

The substrate provided with this amorphous IGO film was again mounted in a sputtering apparatus. Film formation by sputtering was conducted by using a Ni target, and a Ni electrode was formed on the amorphous IGO film, whereby a schottky barrier junction was obtained. Further, Au was formed into a film on this Ni electrode by sputtering, whereby a schottky barrier diode element having a simple configuration was obtained. The resulting element was evaluated in the same manner as in Example 1. The results are shown in Table 2.

Examples 13 to 20

Schottky bather diode elements were prepared and evaluated in the same manner as in Example 12 while changing the composition or the like of the oxide semiconductor appropriately. The results are shown in Table 2.

The "4H—SiC" means a hexagonal SiC substrate having a 4-layer repeating structure, and the "YSZ" means a yttrium stabilized zirconium substrate.

Further, since high resistant substrates were used in Examples 13, 16, 18, 19 and 20, measurement of electricity was conducted by applying a terminal to the ohmic electrode and the schottky electrode.

Comparative Example 1

An n-type silicon (Si) substrate having a resistivity of 0.02 Ω·cm was prepared. By treating with dilute hydrofluoric acid, a naturally oxidized film formed on the surface of the substrate was removed. This Si substrate was mounted in a sputtering apparatus (HSM552, manufactured by Shimadzu Corporation). First, Ti was formed as an ohmic electrode. Subsequently, by using a SiC target (manufactured by Sumitomo Osaka Cement Co., Ltd.) as a sputtering target, sputtering discharge was conducted at RF of 100 W. As a result, on the Ti layer formed on the Si substrate, a 1 μm-thick SiC film was formed.

Subsequently, the SiC film was patterned by photolithography to obtain a desired pattern. Then, annealing was conducted in the air at 300° C. for 1 hour. As a result of evaluating the SiC film by XRD and SEM, the film was confirmed to be polycrystalline.

The substrate provided with this polycrystalline SiC film was again mounted in a sputtering apparatus. Film formation by sputtering was conducted by using a Ni target, and a Ni electrode was formed on the polycrystalline SiC film, whereby a schottky barrier junction was obtained. Further, Au was formed into a film on this Ni electrode by sputtering, whereby a schottky barrier diode element having a simple configuration was obtained.

The resulting element was evaluated in the same manner as in Example 1. The results are shown in Table 2.

The element obtained in Comparative Example 1 had a carrier concentration of $5\times10^{15}$ cm$^{-3}$. However, it had an n value exceeding 10, showing no satisfactory diode characteristics. The dielectric breakdown field was 0.1 MV/cm.

Comparative Example 2

A schottky barrier diode composed of polycrystalline GaN was prepared and evaluated in the same manner as in Comparative Example 1, except that sputtering was conducted by using monocrystalline GaN as a target instead of the SiC target. The results obtained are shown in Table 2.

The element obtained in Comparative Example 2 had an n value exceeding 10, showing no satisfactory diode characteristics. The dielectric breakdown field was 0.1 MV/cm.

Comparative Example 3

A schottky barrier diode was prepared and evaluated in the same manner as in Comparative Example 1, except that an oxide material having a composition of $In_2O_3:Al_2O_3=20:80$ wt. % was used as a target instead of the SiC target and the annealing after the semiconductor film formation was conducted at 150° C. The results are shown in Table 2.

The element obtained in Comparative Example 3 had a sufficiently large band gap of 5.8 eV or more, but had a significantly small carrier concentration of less than $10^{13}$ cm$^{-3}$. Therefore, it was impossible to obtain sufficient forwardly-directed electric current.

TABLE 2

| | Example 12 | Example 13 | Example 14 | Example 15 |
|---|---|---|---|---|
| Schottky electrode | Ni | Ni | Ni | Ni |
| Work function (eV) of Schottky electrode | 5.1 | 5.1 | 5.1 | 5.1 |
| Substrate | Si wafer (n type) | Sapphire | 4H-SiC | Si wafer (n type) |
| Top electrode | Au | Au | Au | Au |
| Contact electrode | Ti | Ti | Ti | Ti |
| Ohmic electrode | Ti | Ti | Ti | Ti |
| Work function (eV) of Ohmic electrode | 4.1 | 4.1 | 4.1 | 4.1 |
| Semiconductor composotion (wt %) | $In_2O_3:Ga_2O_3 =$ 78:22 | $In_2O_3:Ga_2O_3 =$ 85:15 | $In_2O_3:Ga_2O_3 =$ 90:10 | $In_2O_3:TiO_2 =$ 81:19 |
| Semiconductror composition (at %) | In:Ga = 70.5:29.5 | In:Ga = 79.3:20.7 | In:Ga = 85.9:14.1 | In:Ga = 71.0:29.0 |
| Semiconductor film thickness (μm) | 1.0 | 1.0 | 1.0 | 1.0 |
| Annealing conditions after formation of semiconductor film | In the air, 300° C., 1 h | In the air, 300° C., 1 h | In the air, 280° C., 1 h | In the air, 150° C., 1 h |
| Final annealing | Not conducted | Not conducted | Not conducted | Not conducted |
| Band gap (eV) of oxide semiconductor film | 3.2 | 3.1 | 3.1 | 3.1 |
| Carrier concentration (cm$^{-3}$) | $3 \times 10^{14}$ | $1 \times 10^{15}$ | $2 \times 10^{15}$ | $2 \times 10^{16}$ |
| n value | 2.2 | 2.3 | 2.8 | 3.5 |
| Dielectric breakdown field (MV/cm) | 2.7 | 2.5 | 2.3 | 2.2 |
| Results of XRD measurement of semiconductor | Amorphous | Amorphous | Amorphous | Amorphous |
| Forwardly-directed voltage (V) | 2.5 | 2.3 | 2.3 | 2.1 |
| On-current density (A/cm$^2$) | >10 | >10 | >10 | >10 |

TABLE 2-continued

|  | Example 16 | Example 17 | Example 18 | Example 19 |
|---|---|---|---|---|
| Schottky electrode | Ni | Ni | Ni | Ni |
| Work function (eV) of Schottky electrode | 5.1 | 5.1 | 5.1 | 5.1 |
| Substrate | YSZ | Polycrystalline Si wafer (n type) | Alkali-free glass | Alkali-free glass |
| Top electrode | Au | Au | Au | Au |
| Contact electrode | Ti | Ti | Mo | Mo |
| Ohmic electrode | Ti | Ti | Ti | Ti |
| Work function (eV) of Ohmic electrode | 4.1 | 4.1 | 4 | 4 |
| Semiconductor composotion (wt %) | $In_2O_3:ZnO =$ 72:28 | $In_2O_3:SnO_2 =$ 69:31 | $In_2O_3:Ga_2O_3:ZnO =$ 44.2:29.9:25.9 | $In_2O_3:Ga_2O_3:Al_2O_3 =$ 10:50:40 |
| Semiconductror composition (at %) | In:Zn = 60.1:39.9 | In:Sn = 70.7:29.3 | In:Ga:Zn = 33.3:33.3:33.3 | In:Ga:Al = 5.2:38.4:56.4 |
| Semiconductor film thickness (μm) | 1.0 | 1.0 | 1.0 | 1.0 |
| Annealing conditions after formation of semiconductor film | In the air, 250° C., 1 h | In the air, 250° C., 1 h | In the air, 150° C., 1 h | In the air, 150° C., 1 h |
| Final annealing | Not conducted | Not onducted | Not conducted | Not conducted |
| Band gap (eV) of oxide semiconductor film | 3.2 | 3.1 | 3.4 | 5.6 |
| Carrier concentration (cm$^{-3}$) | $1 \times 10^{17}$ | $2 \times 10^{15}$ | $2 \times 10^{15}$ | $2 \times 10^{14}$ |
| n value | 3.6 | 3.1 | 2.2 | 2.2 |
| Dielectric breakdown field (MV/cm) | 2.3 | 2.2 | 2.3 | 2.3 |
| Results of XRD measurement of semiconductor | Amorphous | Amorphous | Amorphous | Amorphous |
| Forwardly-directed voltage (V) | 2.5 | 2.4 | 2.3 | 2.3 |
| On-current density (A/cm$^2$) | >10 | >10 | >10 | >10 |

|  | Example 20 | Comp. Ex. 1 | Comp. Ex. 2 | Comp. Ex. 3 |
|---|---|---|---|---|
| Schottky electrode | Ni | Ni | Ni | Ni |
| Work function (eV) of Schottky electrode | 5.1 | 5.1 | 5.1 | 5.1 |
| Substrate | Alkali-free glass | Si wafer (n type) | Si wafer (n type) | Si wafer (n type) |
| Top electrode | Au | Au | Au | Au |
| Contact electrode | Mo | Ti | Ti | Ti |
| Ohmic electrode | Ti | Ti | Ti | Ti |
| Work function (eV) of Ohmic electrode | 4 | 4.1 | 4.1 | 4.1 |
| Semiconductor composotion (wt %) | $In_2O_3:Ga_2O_3:Al_2O_3 =$ 10:60:30 | SiC | GaN | $In_2O_3:Al_2O_3 =$ 20:80 |
| Semiconductror composition (at %) | In:Ga:Al = 5.5:49.2:45.3 | — | — | In:Al = 8.4:91.6 |
| Semiconductor film thickness (μm) | 1.0 | 1.0 | 1.0 | 1.0 |
| Annealing conditions after formation of semiconductor film | In the air, 150° C., 1 h | In the air, 300° C., 1 h | In the air, 300° C., 1 h | In the air, 150° C., 1 h |
| Final annealing | Not conducted | Not conducted | Not conducted | Not conducted |
| Band gap (eV) of oxide semiconductor film | 5.4 | 2.8 | 2.7 | 5.8 |
| Carrier concentration (cm$^{-3}$) | $9 \times 10^{14}$ | $5 \times 10^{15}$ | $5 \times 10^{16}$ | $<1 \times 10^{13}$ |
| n value | 2.2 | >10 | >10 | >10 |
| Dielectric breakdown field (MV/cm) | 2.3 | 0.1 | 0.1 | >10 |
| Results of XRD measurement of semiconductor | Amorphous | Polycrystaline | Polycrystaline | Amorphous |
| Forwardly-directed voltage (V) | 2.3 | 4 | 4.5 | >10 |
| On-current density (A/cm$^2$) | >10 | 1.2 | 1 | $<1 \times 10^{-4}$ |

INDUSTRIAL APPLICABILITY

The schttoky barrier diode element of the invention can be preferably used in an electric circuit, an electric apparatus, an electronic apparatus, an electric vehicle or the like that require a high-speed operation or switching properties.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The specification of a Japanese application on the basis of which the present application claims Paris Convention priority is incorporated herein by reference in its entirety.

The invention claimed is:

1. A structural body comprising a substrate, a first metal thin film, an oxide semiconductor layer, and a second metal thin film,
    wherein the substrate, the first metal thin film, the oxide semiconductor layer, and the second metal thin film are stacked in this order, or
    the substrate, the second metal thin film, the oxide semiconductor layer, and the first metal thin film are stacked in this order,
    wherein the oxide semiconductor layer consists of polycrystalline and/or amorphous oxide semiconductor which comprises indium (In) as a main component, each of the first metal thin film and the second metal thin film is in direct contact with the oxide semiconductor layer and a thickness of the oxide semiconductor layer is from 50 nm to 20 µm, wherein the first metal thin film is a schottky electrode layer and the second metal thin film is an ohmic electrode layer, wherein the schottky electrode layer comprises Ru, Au, Pd, Ni, Ir, Pt or alloys thereof.

2. The structural body according to claim 1, wherein the oxide semiconductor layer has a band gap of 3.0 eV or more and 5.6 eV or less.

3. The structural body according to claim 1, wherein the oxide semiconductor layer comprises one or more elements selected from the group consisting of In, Ti, Zn, Ga and Sn.

4. The structural body according to claim 1, wherein the oxide semiconductor layer comprises indium (In), and
an atomic composition percentage of indium relative to total metal elements contained in the oxide semiconductor layer ([In]/([In]+[total metal elements other than In])×100) is 30 to 100 at %.

5. The structural body according to claim 1, wherein a carrier concentration at room temperature of the oxide semiconductor layer is $1 \times 10^{14}$ cm$^{-3}$ or more and $1 \times 10^{17}$ cm$^{-3}$ or less.

6. A power semiconductor device in which the structural body according to claim 1 is used.

7. A diode device in which the structural body according to claim 1 is used.

8. A schottky barrier diode element in which the structural body according to claim 1 is used.

9. The structural body according to claim 1, wherein the oxide semiconductor layer further comprises one or more elements selected from Al, Si, Zn, Ga, Hf, Zr, Ce, Sm and Sn.

10. The structural body according to claim 1, wherein the oxide semiconductor layer is crystalline, and at least one element selected from Al, Si, Ce, Ga, Hf, Zr and Sm is contained in the oxide semiconductor layer at an amount ratio of 3 at % or more and 30 at % or less relative to the total metal elements.

11. The structural body according to claim 5, wherein the carrier concentration in the oxide semiconductor layer being $1 \times 10^{15}$ cm$^{-3}$ or more and $5 \times 10^{16}$ cm$^{-3}$ or less.

12. The structural body according to claim 1, wherein the oxide semiconductor layer consists of an amorphous oxide semiconductor which comprises indium (In) as a main component.

13. The structural body according to claim 1, wherein the oxide semiconductor layer does not include $Ga_2O_3$.

14. The structural body according to claim 1, wherein the thickness of the oxide semiconductor layer is 50 nm to 12 µm.

15. The structural body according to claim 1, wherein the thickness of the oxide semiconductor layer is 50 nm to 2 µm.

16. The structural body according to claim 1, wherein the thickness of the oxide semiconductor layer is 50 nm to 1.2 µm.

* * * * *